United States Patent
Gong et al.

(10) Patent No.: US 12,230,703 B2
(45) Date of Patent: Feb. 18, 2025

(54) SEMICONDUCTOR POWER DEVICE

(71) Applicant: SUZHOU ORIENTAL SEMICONDUCTOR CO., LTD., Jiangsu (CN)

(72) Inventors: Yi Gong, Jiangsu (CN); Zhendong Mao, Jiangsu (CN); Wei Liu, Jiangsu (CN); Lei Liu, Jiangsu (CN); Yuanlin Yuan, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/425,890

(22) PCT Filed: Dec. 5, 2019

(86) PCT No.: PCT/CN2019/123317
§ 371 (c)(1),
(2) Date: Jul. 26, 2021

(87) PCT Pub. No.: WO2021/103093
PCT Pub. Date: Jun. 3, 2021

(65) Prior Publication Data
US 2022/0285544 A1 Sep. 8, 2022

(30) Foreign Application Priority Data
Nov. 27, 2019 (CN) .......................... 201911184108.X

(51) Int. Cl.
*H01L 29/78* (2006.01)
*H01L 29/08* (2006.01)

(52) U.S. Cl.
CPC ...... *H01L 29/7804* (2013.01); *H01L 29/7813* (2013.01); *H01L 29/7831* (2013.01); *H01L 29/0865* (2013.01)

(58) Field of Classification Search
CPC ............ H01L 29/7813; H01L 29/7825; H01L 29/66704; H01L 29/42324;
(Continued)

(56) References Cited

U.S. PATENT DOCUMENTS 5,225,361 A 7/1993 Kakiuchi et al.
6,388,922 B1* 5/2002 Fujiwara ........... H01L 29/42336
257/315
(Continued)

FOREIGN PATENT DOCUMENTS

| CN | 102169882 | 8/2011 |
| CN | 109755309 | 5/2019 |
| JP | H07106444 | 4/1995 |

OTHER PUBLICATIONS

PCT/CN2019/123317 International Search Report dated Aug. 18, 2020.

*Primary Examiner* — Samuel A Gebremariam
*Assistant Examiner* — Jonas T Beardsley
(74) *Attorney, Agent, or Firm* — Michael Best & Friedrich LLP

(57) ABSTRACT

Provided is a semiconductor power device. The device includes: at least one p-type body region located on the top of an n-type drift region, a first n-type source region and a second n-type source region located within the p-type body region, a first gate structure configured to control a first current channel between the first n-type source region and the n-type drift region to be turned on or off; and a second gate structure configured to control a second current channel between the second n-type source region and the n-type drift region to be turned on or off. The second gate structure is recessed in the n-type drift region.

4 Claims, 2 Drawing Sheets

(58) Field of Classification Search
CPC ......... H01L 29/66825; H01L 29/40114; H01L 29/42328; H01L 29/42336
See application file for complete search history.

(56) References Cited

U.S. PATENT DOCUMENTS

| | | | |
|---|---|---|---|
| 2013/0075810 A1* | 3/2013 | Hsieh .................. | H01L 27/0255 257/328 |
| 2014/0054685 A1* | 2/2014 | Consentino ....... | H01L 29/42376 438/270 |
| 2015/0325663 A1* | 11/2015 | Wang .................. | H01L 29/1037 438/266 |

* cited by examiner

SEMICONDUCTOR POWER DEVICE

CROSS-REFERENCE TO RELATED APPLICATIONS

This is a National Stage Application, filed under 35 U.S.C. 371, of International Patent Application No. PCT/CN2019/123317, filed on Dec. 5, 2019, which claims priority to Chinese Patent Application No. 201911184108.X filed with the CNIPA on Nov. 27, 2019, the disclosures of which are incorporated herein by reference in their entireties.

TECHNICAL FIELD

The present application belongs to the technical field of semiconductor power devices, for example, a semiconductor power device with a small chip size and a fast reverse recovery speed.

BACKGROUND

An equivalent circuit of a semiconductor power device in the related art is shown in FIG. 1. The semiconductor power device includes a source 101, a drain 102, a gate 103, and a body diode 104. The body diode 104 is an intrinsic parasitic structure in the semiconductor power device. In the related art, the operation mechanism of the semiconductor power device is as follows: 1) when a gate-source voltage Vgs is less than a threshold voltage Vth of the semiconductor power device, and a drain-source voltage Vds is greater than 0 V, the semiconductor power device is in a turn-off state; 2) when the gate-source voltage Vgs is greater than the threshold voltage Vth of the semiconductor power device, and the drain-source voltage Vds is greater than 0 V, the semiconductor power device is turned on forward, and in this case, a current flows from the drain to the source through a current channel at the gate. In the related art, if the semiconductor power device is turned off, when the drain-source voltage Vds is less than 0 V, the body diode of the semiconductor power device is in a positive bias state, an inverse current flows from the source to the drain through the body diode. In this case, the current in the body diode injects minority carriers, and these minority carriers perform a backward recovery when the semiconductor power device is turned on again, causing a relatively large backward-recovery current and a long backward-recovery time.

SUMMARY

The present application provides a semiconductor power device with a fast reverse recovery speed to avoid the long reverse recovery time caused by minority carrier injection of a semiconductor power device.

The present disclosure provides a semiconductor power device. The semiconductor power device includes an n-type drain region, an n-type drift region, at least one p-type body region, a first n-type source region, a second n-type source region, a first gate structure and a second gate structure.

The n-type drift region is located above the n-type drain region. The at least one p-type body region is located on the top of the n-type drift region. The first n-type source region and the second n-type source region are located within the p-type body region.

The first gate structure is configured to control a first current channel between the first n-type source region and the n-type drift region to be turned on or off. The first gate structure includes a first gate dielectric layer, a first gate, an n-type floating gate, and an opening in the first gate dielectric layer. The first gate and the n-type floating gate are located above the first gate dielectric layer. In a lateral direction, the n-type floating gate is located on a side close to the n-type drift region, the first gate is located on a side close to the first n-type source region and extends above the n-type floating gate, and the first gate acts on the n-type floating gate through capacitive coupling. The n-type floating gate contacts the p-type body region through the opening to form a p-n junction diode.

The second gate structure is configured to control a second current channel between the second n-type source region and the n-type drift region to be turned on or off. The second gate structure includes a gate trench recessed in the n-type drift region, and a second gate dielectric layer and a second gate which are located in the gate trench.

In an embodiment, in the semiconductor power device of the present application, the first gate covers a sidewall of the n-type floating gate on a side close to the n-type drift region.

In an embodiment, the semiconductor power device of the present application further includes a shielding gate located in the gate trench. The second gate is located in the upper part of the gate trench. The shielding gate is located in the lower part of the gate trench. The shielding gate is isolated from the second gate and the n-type drift region through an insulating dielectric layer.

In an embodiment, the semiconductor power device of the present application, the shielding gate is in the lower part of the gate trench and extends upwardly into the upper part of the gate trench.

In an embodiment, in the semiconductor power device of the present application, the width of the upper part of the gate trench is greater than the width of the lower part of the gate trench.

In an embodiment, in the semiconductor power device of the present application, the opening is located below the n-type floating gate and on a side close to the n-type drift region.

According to the embodiments of the present disclosure, when the semiconductor power device is in a forward blocking state or forward turned on, the semiconductor power device has a high threshold voltage; when the semiconductor power device is reversely turned on, the first current channel has a low threshold voltage, so that the first current channel is turned on at a low gate voltage (or a voltage of 0 V). This can increase a reverse current flowing through the first current channel, reduce a current flowing through a parasitic body diode in the semiconductor power device, and improve the reverse recovery speed of the semiconductor power device. According to the embodiments of the present disclosure, the second current channel of the semiconductor power device is a vertical current channel. This can reduce the chip size of the semiconductor power device, so that the semiconductor power device can be packaged in a smaller volume.

BRIEF DESCRIPTION OF DRAWINGS

Drawings used in the embodiments are briefly described hereinafter.

DETAILED DESCRIPTION

Figure 1:
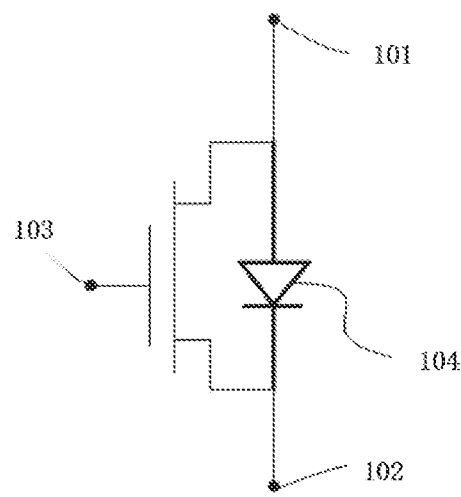
FIG. 1 is an equivalent circuit diagram of a semiconductor power device in the related art.

The scheme of the present disclosure is described hereinafter through specific implementations in conjunction with the drawings in the embodiments of the present disclosure. Meanwhile, in the schematic diagrams illustrated in the drawings of the specification, sizes of layers and regions described in the present application are enlarged, and the sizes illustrated in the drawings do not represent actual sizes. The embodiments described in the specification are not intended to limit to the shapes of the regions shown in the drawings, but also include deviations of the obtained shapes, for example, deviations in manufacturing.

Figure 2:
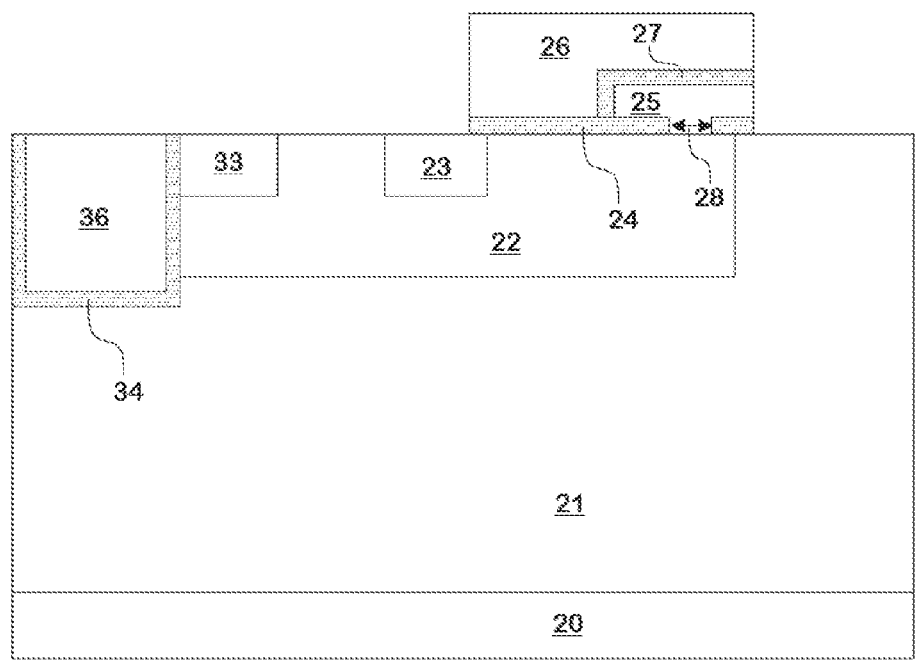
FIG. 2 is a section view of a first embodiment of a semiconductor power device according to the present application.

FIG. 2 is a section view of a first embodiment of a semiconductor power device according to the present application. As shown in FIG. 2, an embodiment of the present disclosure provides a semiconductor power device. The semiconductor power device includes: an n-type drain region 20, an n-type drift region 21, at least one p-type body region 22, a first n-type source region 23, a second n-type source region 33, a first gate structure and a second gate structure. The n-type drift region 21 is located above the n-type drain region 20. The at least one p-type body region 22 is located on the top of the n-type drift region 21, and only one p-type body region 22 is exemplarily shown in FIG. 2. The first n-type source region 23 and the second n-type source region 33 are located within the p-type body region 22.

The first gate structure is configured to control a first current channel between the first n-type source region 23 and the n-type drift region 21 to be turned on or off. The first gate structure includes a first gate dielectric layer 24, an n-type floating gate 25 and a first gate 26. The first gate 26 and the n-type floating gate 25 are located above the first gate dielectric layer 24. In a lateral direction, the n-type floating gate 25 is located on a side close to the n-type drift region 21, the first gate 26 is located on a side close to the first n-type source region 23 and extends above the n-type floating gate 25, the first gate 26 is insulated from the n-type floating gate 25 through an insulating dielectric layer 27, and the first gate 26 acts on the n-type floating gate 25 through capacitive coupling. The insulating dielectric layer 27 is generally silicon dioxide. An opening 28 is formed in the first gate dielectric layer 24. The n-type floating gate 25 contacts the p-type body region 22 through the opening 28 in the first gate dielectric layer 24 to form a p-n junction diode.

In this embodiment of the present disclosure, the first gate 26 of the semiconductor power device extends above the n-type floating gate 25 and may also cover a sidewall of the n-type floating gate 25 on a side close to the n-type drift region 21 at the same time. In this manner, the area of the n-type floating gate 25 covered by the first gate 26 can be increased, thus increasing the capacitive coupling rate of the first gate 26 to the n-type floating gate 25.

In this embodiment of the present disclosure, when the semiconductor power device is in a forward blocking state, the n-type drain region 20 is at a high voltage, the p-n junction diode formed by the n-type floating gate 25 and the p-type body region 22 is forward biased, and the n-type floating gate 25 is charged with positive charges. In this manner, a threshold voltage Vht1 of a current channel below the n-type floating gate 25 is decreased. The voltage of the n-type floating gate 25 is related to the position of the opening 28 in the first gate dielectric layer 24, in an embodiment, the opening 28 in the first gate dielectric layer 24 is located below the n-type floating gate 25 and on a side close to the n-type drift region 21. That is, in the lateral direction, the distance from the center of the opening 28 to a side end of the first gate dielectric layer 24 close to the n-type drift region 21 is less than the distance from the center of the opening 28 to a side end of the first gate dielectric layer 24 close to the first n-type source region 23. That is, in the lateral direction, the opening 28 is located in a region of the first gate dielectric layer 24 closer to the n-type drift region 21. Therefore, such a configuration that the opening 28 is disposed in the first gate dielectric layer 24 to be closer to the n-type drift region 21 can enable the n-type floating gate 25 to be more easily charged with positive charges, thereby increasing the voltage of the n-type floating gate 25 and reducing the threshold voltage of the current channel below the n-type floating gate 25.

In this embodiment of the present disclosure, when the semiconductor power device is in a forward blocking state or a forward turn-on state, the drain-source voltage Vds is greater than 0 V, the threshold voltage Vht1 of the current channel below the n-type floating gate 25 has a very little influence on the threshold voltage Vth of the entire first current channel, and the first current channel still has a high threshold voltage Vth. When the semiconductor power device in this embodiment of the present disclosure is turned off and the source-drain voltage Vsd is greater than 0 V, the threshold voltage Vth1 of the current channel below the n-type floating gate 25 has a great influence on the threshold voltage Vth of the first current channel, so that the first current channel has a low threshold voltage Vth, thus the first current channel is turned on at a low gate voltage (or a voltage of 0 V). In this manner, a reverse current flowing through the first current channel can be increased, a current flowing through a parasitic body diode in the semiconductor power device is reduced, and the reverse recovery speed of the semiconductor power device is improved.

The second gate structure is configured to control a second current channel between the second n-type source region 33 and the n-type drift region 21 to be turned on or off. The second gate structure includes a gate trench recessed in the n-type drift region, and a second gate dielectric layer 34 and a second gate 36 which are located in the gate trench. The second gate 36 controls the second current channel between the second n-type source region 33 and the n-type drift region 21 to be turned on or off by connecting to a gate voltage. The second current channel is a vertical current channel, which can reduce the chip size of the semiconductor power device, so that the semiconductor power device can be packaged in a smaller volume.

Figure 3:
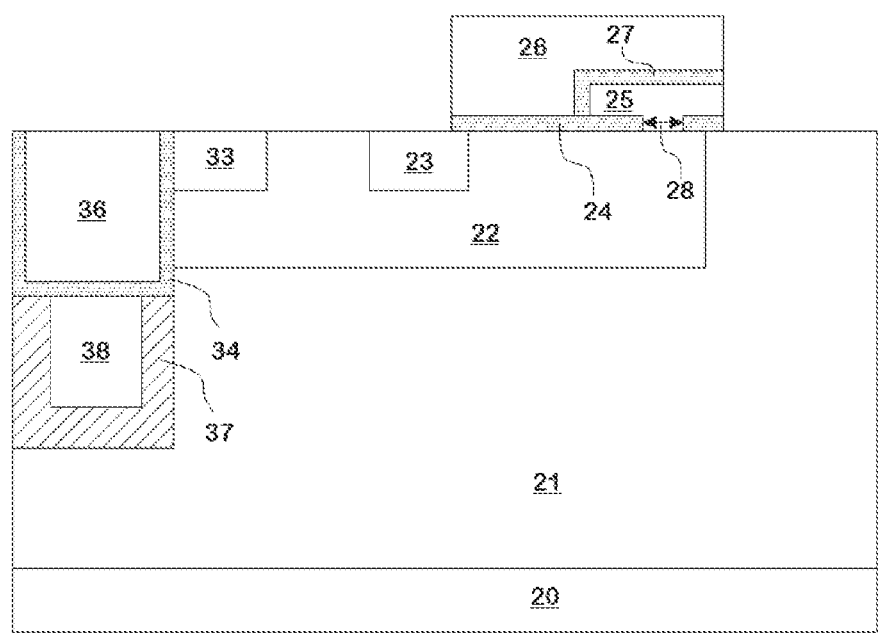
FIG. 3 is a section view of a second embodiment of a semiconductor power device according to the present application.

FIG. 3 is a section view of a second embodiment of a semiconductor power device according to the present application. As shown in FIG. 3, in this embodiment of the present disclosure, the second gate structure in the semiconductor power device further includes a shielding gate 38 located in the gate trench. In this case, the second gate 36 is located in the upper part of the gate trench. The shielding gate 38 is located in the lower part of the gate trench. The shielding gate 38 is isolated from the second gate 36 by an insulating dielectric layer. In this embodiment, the shielding gate 38 is isolated from the n-type drift region 21 by a field oxide layer 37, and the shielding gate 38 is isolated from the second gate 36 by the second gate dielectric layer 34. The shielding gate 38 is generally connected to a source voltage to form a lateral voltage on the bottom of the gate trench, and the withstand voltage of the semiconductor power device is improved. In this embodiment of the present disclosure, the shielding gate 38 of the semiconductor power device may further be in the lower part of the gate trench and extend upwardly into the upper part of the gate trench. In this case, the width of the upper part of the gate trench may be greater than the width of the lower part of the gate trench. This structure is not shown in detail in the embodiments of the present disclosure.

What is claimed is:

1. A semiconductor power device, comprising:
an n-type drain region, an n-type drift region located above the n-type drain region, at least one p-type body region located on a top of the n-type drift region, and a first n-type source region and a second n-type source region which are located within the at least one p-type body region, wherein a first current channel between the first n-type source region and the n-type drift region is formed in the at least one p-type body region;
a first gate structure, which is configured to control a first current channel to be turned on or off, wherein the first gate structure comprises a first gate dielectric layer, a first gate and an n-type floating gate; the first gate and the n-type floating gate are located above the first gate dielectric layer; in a lateral direction, the n-type floating gate is located on a side close to the n-type drift region, the first gate is located on a side close to the first n-type source region and extends above the n-type floating gate, the first gate acts on the n-type floating gate through capacitive coupling; and the n-type floating gate contacts the p-type body region through an opening in the first gate dielectric layer to form a p-n junction diode in the opening, and the opening is located below the n-type floating gate, wherein the first gate extends above the n-type floating gate to cover two sidewalls of the n-type floating gate relative to the n-type drift region, and in the lateral direction, a distance from a center of the opening to a side end of the first gate dielectric layer close to the n-type drift region is less than a distance from the center of the opening to a side end of the first gate dielectric layer close to the first n-type source region; and
a second gate structure, which is configured to control a second current channel between the second n-type source region and the n-type drift region to be turned on or off, wherein the second gate structure comprises a gate trench recessed in the n-type drift region, and a second gate dielectric layer and a second gate which are located in the gate trench.

2. The semiconductor power device of claim 1, further comprising: a shielding gate located in the gate trench, wherein the second gate is located in an upper part of the gate trench, the shielding gate is located in a lower part of the gate trench, and the shielding gate is isolated from the second gate and the n-type drift region through an insulating dielectric layer.

3. The semiconductor power device of claim 2, wherein the shielding gate is in the lower part of the gate trench and extends upwardly into the upper part of the gate trench.

4. The semiconductor power device of claim 3, wherein a width of the upper part of the gate trench is greater than a width of the lower part of the gate trench.

* * * * *